(12) United States Patent
Jiang (10) Patent No.: US 12,193,288 B2
(45) Date of Patent: Jan. 7, 2025

(54) DISPLAY PANEL

(71) Applicant: Wuhan China Star Optoelectronics Semiconductor Display Technology Co., Ltd., Wuhan (CN)

(72) Inventor: Yingchuan Jiang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 459 days.

(21) Appl. No.: 17/623,204

(22) PCT Filed: Dec. 17, 2021

(86) PCT No.: PCT/CN2021/139361
§ 371 (c)(1),
(2) Date: Dec. 27, 2021

(87) PCT Pub. No.: WO2023/103061
PCT Pub. Date: Jun. 15, 2023

(65) Prior Publication Data
US 2023/0189581 A1      Jun. 15, 2023

(30) Foreign Application Priority Data
Dec. 9, 2021  (CN) ......................... 202111500321.4

(51) Int. Cl.
*H10K 59/131* (2023.01)
*H10K 50/842* (2023.01)

(52) U.S. Cl.
CPC ....... *H10K 59/131* (2023.02); *H10K 50/8426* (2023.02)

(58) Field of Classification Search
CPC ............. H10K 59/127; H10K 59/1275; H10K 50/8426
See application file for complete search history.

(56) References Cited

U.S. PATENT DOCUMENTS

2020/0381590 A1*  12/2020  Yanagisawa ........ H01L 33/0093
2021/0407981 A1*  12/2021  Ahn ......................... H01L 25/18
(Continued)

FOREIGN PATENT DOCUMENTS

| CN | 1714131 A | 12/2005 |
| CN | 203055347 U | 7/2013 |

(Continued)

*Primary Examiner* — Erik Kielin
(74) *Attorney, Agent, or Firm* — PV IP PC; Wei Te Chung (57) ABSTRACT

A display panel includes a driving substrate, a display substrate, and an adhering layer. The driving substrate includes a first bonding electrode and a driving circuit of the display panel. The display substrate includes a second bonding electrode and a display unit of the display panel. The second bonding electrode corresponds to the first bonding electrode of the driving substrate. The adhering layer is disposed between the driving substrate and the display substrate, and includes a conductive glue and an adhesive. The conductive glue is electrically connected to the first bonding electrode of the driving substrate and the second bonding electrode of the display substrate, so that the driving circuit is electrically connected to the display unit, and the adhesive adheres surfaces of the driving substrate and the display substrate facing each other.

20 Claims, 10 Drawing Sheets (56) References Cited

U.S. PATENT DOCUMENTS

2022/0231110 A1* 7/2022 Cho .................... H10K 59/131
2023/0036259 A1* 2/2023 Tanaka .............. H01L 27/14623

FOREIGN PATENT DOCUMENTS

| CN | 109461386 A | 3/2019 |
| CN | 110265373 A | 9/2019 |
| CN | 110444110 A | 11/2019 |
| CN | 111190295 A | 5/2020 |
| CN | 112017550 A | 12/2020 |
| CN | 113891586 A | 1/2022 |
| JP | H0432171 A | 2/1992 |

* cited by examiner

DISPLAY PANEL

CROSS-REFERENCE TO RELATED APPLICATION

This application is a national phase application under 35 U.S.C. § 371 of PCT Application No. PCT/CN2021/139361, filed Dec. 17, 2021, which claims priority to Chinese Application No. 202111500321.4, filed Dec. 9, 2021, the contents of which are incorporated herein by reference in their entirety.

FIELD OF INVENTION

The present invention is related to the field of display technology and specifically to a display device applied to a daughter-mother board splicing technology.

BACKGROUND OF INVENTION

In a display panel applied to a daughter-mother board splicing technology, a mother board is a driving substrate of the display panel, and a daughter board is a display substrate of the display panel. The driving substrate and the display substrate can be manufactured separately, then the driving substrate and the display substrate are electrically connected to each other to form a driving circuit, and finally form a complete display panel.

The driving substrate and the display substrate respectively has a corresponding bonding electrode, and pairs of electrodes are bonded with conductive glue (e.g., silver glue) through a bonding technique, so as to conduct the driving substrate and the display substrate.

The conductive glue and the bonding electrodes of the driving substrate and the display substrate each have a certain thickness. Between the driving substrate and the display substrate, in addition to the conductive glue and the bonding electrodes, a remaining space is a cavity with only air. The air in the cavity can possibly expand or contract due to a temperature of an environment, which affects a stability of a connection between the driving substrate and the display substrate. When the air in the cavity is cooled and contracts, the driving substrate and the display substrate are squeezed by an external atmosphere, causing the display panel to crack partially. When the air in the cavity is heated and expands, the driving substrate and the display substrate is squeezed by an internal air, causing the driving substrate and the display substrate to separate from the conductive glue, thereby causing an open circuit of the driving circuit of the display panel.

Therefore, in the display panel applied to the daughter-mother board splicing technology in the prior art, since the driving substrate and the display substrate adhered by the conductive glue have the cavity, the reliability of the display panel is affected, thereby reducing a service life of the display panel.

SUMMARY OF INVENTION

The present invention provides a display panel applied for a daughter-mother board splicing technology, which can prevent a driving substrate and a display substrate adhered by an adhesive from having cavities, such that a reliability of the display panel increases, and a service life of the display panel is prolonged.

The display of the present invention includes a driving substrate, a display substrate, and an adhering layer. The driving substrate includes a first bonding electrode and a driving circuit of the display panel. The display substrate includes a second bonding electrode and a display unit of the display panel. The second bonding electrode corresponds to the first bonding electrode of the driving substrate. The adhering layer is disposed between the driving substrate and the display substrate and includes a conductive glue and an adhesive. The conductive glue electrically connects the first bonding electrode of the driving substrate and the second bonding electrode of the display panel to enable the driving circuit to electrically connect the display unit, and the adhesive adheres surfaces of the driving substrate and the display substrate facing each other.

In an embodiment of the present invention, a material of the adhesive includes a liquid adhesive. The adhering layer further includes a surrounding dam. The surrounding dam surrounds an outer periphery of the adhesive. The adhesive is filled among the driving substrate, the display substrate, and the surrounding dam.

In this embodiment of the present invention, the surrounding dam is defined with a vent.

In this embodiment of the present invention, the display panel includes a bonding region and a non-bonding region, and the bonding region surrounds the non-bonding region. The first bonding electrode of the driving substrate and the second bonding electrode of the display substrate are positioned at the non-bonding region of the display panel. The adhesive of the adhering layer includes a first adhesive and a second adhesive. The first adhesive is positioned at the non-bonding region of the display panel. The second adhesive is positioned at the bonding region of the display panel.

In this embodiment of the present invention, the surrounding dam includes a first surrounding dam and a second surrounding dam. The first surrounding dam surrounds an outer periphery of the first adhesive. The second surrounding dam surrounds an outer periphery of the second adhesive.

In this embodiment of the present invention, the first surrounding dam is defined with a first vent.

In this embodiment of the present invention, the second surrounding dam is defined with a second vent.

In an embodiment of the present invention, the adhesive includes a solid adhesive. The adhesive includes a through hole. The through hole corresponds to the first bonding electrode of the driving substrate and the second bonding electrode of the display substrate. The conductive glue is disposed in the through hole.

In an embodiment of the present invention, the display panel includes a bonding region and a non-bonding region, and the bonding region surrounds the non-bonding region. The first bonding electrode of the driving substrate and the second bonding electrode of the display substrate are positioned at the non-bonding region of the display panel. The adhesive of the adhering layer includes a first adhesive and a second adhesive. The first adhesive is positioned at the non-bonding region of the display panel. The second adhesive is positioned at the bonding region of the display panel.

In this embodiment of the present invention, a material of the first adhesive includes a liquid adhesive, and a material of the second adhesive includes a solid adhesive. The second adhesive surrounds an outer periphery of the first adhesive. The second adhesive includes a through hole corresponding to the first bonding electrode of the driving substrate and the second bonding electrode of the display substrate. The conductive glue is disposed in the through hole.

Or, in this embodiment of the present invention, a material of the first adhesive includes a solid adhesive, and a material of the second adhesive includes a liquid adhesive. The second adhesive surrounds an outer periphery of the first adhesive. The second surrounding dam surrounds an outer periphery of the second adhesive.

In this embodiment of the present invention, the second surrounding dam is defined with a second vent.

In an embodiment of the present invention, the liquid adhesive includes a photocuring liquid adhesive.

In an embodiment of the present invention, the solid adhesive includes an optical clear adhesive.

In an embodiment of the present invention, the display panel further includes a plurality of the display substrates, and the display substrates are arranged in an array on the driving substrate.

In this embodiment of the present invention, the adhering layer is disposed between the driving substrate and the display substrates, and the adhesive of the adhering layer adheres surfaces of the driving substrate and the display substrates facing one another.

Compared with the display panel in the prior art that only adhere the driving substrate and the display substrate by the conductive glue, the adhesive of the display panel of the present invention is fully filled between the driving substrate and the display substrate, i.e., no cavity with air exists between the driving substrate and the display substrate. Therefore, the adhesive of the present invention fills the cavity between the driving substrate and the display substrate, and enhances an adhesiveness between the driving substrate and the display substrate, thereby increasing the reliability of the display panel and prolonging the service life of the display panel. In addition, when the adhesive adopts the liquid adhesive, in conjunction with the vent on the surrounding dam, and when the display substrate is pressed to the driving substrate, the air between the driving substrate and the display is exhausted through the vent, effectively assisting a manufacturing of the display panel of the present invention. Or, when the adhesive adopts the solid adhesive, the adhesive can further improve a manufacturing efficiency of the display panel.

DETAILED DESCRIPTION OF EMBODIMENTS

In order to make above purposes, features, and advantages of the present invention more obvious and understandable, the following is a detailed description of preferred embodiments of the present invention in conjunction with accompanying drawings.

Figure 1:
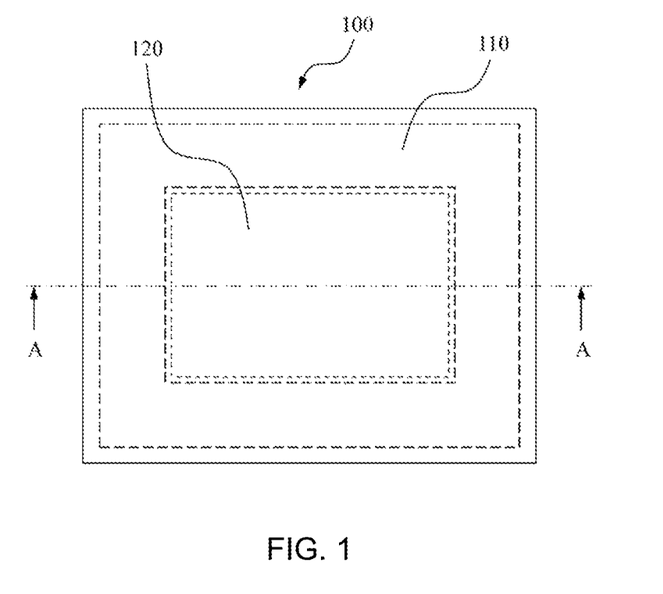
FIG. 1 is a top view of a display panel of the present invention.
Figure 2:
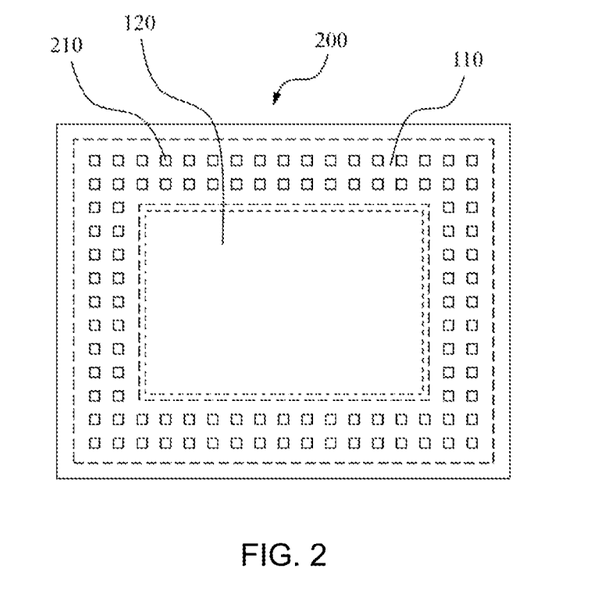
FIG. 2 is a top view of a driving substrate of the display panel of the present invention.
Figure 3:
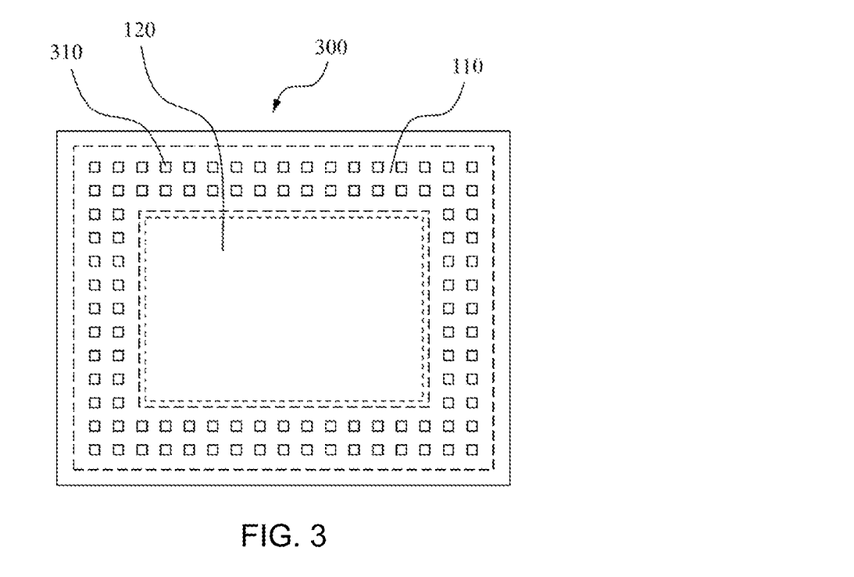
FIG. 3 is a bottom view of a display substrate of the display panel of the present invention.

The invention provides a display panel applied to a daughter-mother board splicing technology. Referring to FIG. 1, which is a top view of a display panel 100 of the present invention. Referring to FIGS. 2-3, FIG. 2 is a top view of a driving substrate 200 of the display panel 100 of the present invention, and FIG. 3 is a bottom view of a display substrate 300 of the display panel 100 of the present invention. In the daughter-mother board splicing technology, the mother board is the driving substrate 200 of the display panel 100 and the daughter board is the display substrate 300 of the display panel 100. Generally speaking, the driving substrate 200 includes a driving circuit of the display panel 100, and the display substrate 300 includes a display unit of the display panel 100. For example, the display unit is an organic light emitting transistor (OLED). When the driving substrate 200 and the display substrate 300 are electrically connected to each other to form a driving circuit, the display unit can perform a displaying operation through the driving circuit, and ultimately forms a complete OLED display panel.

As shown in FIG. 1, the display panel 100 includes a bonding region 110 and a non-bonding region 120. As shown in FIG. 2, the driving substrate 200 includes a first bonding electrode 210, and the first bonding electrode 210 is positioned in the bonding region 110 of the display panel 100. As shown in FIG. 3, the display substrate 300 includes a second bonding electrode 310, and the second bonding electrode 310 is positioned in the bonding region 110 of the display panel 100. In order to electrically connect the driving substrate 200 and the display substrate 300 to each other to form the driving circuit, the second bonding electrode 310 of the display substrate 300 corresponds to the first bonding electrode 210 of the driving substrate 200.

Figure 4:
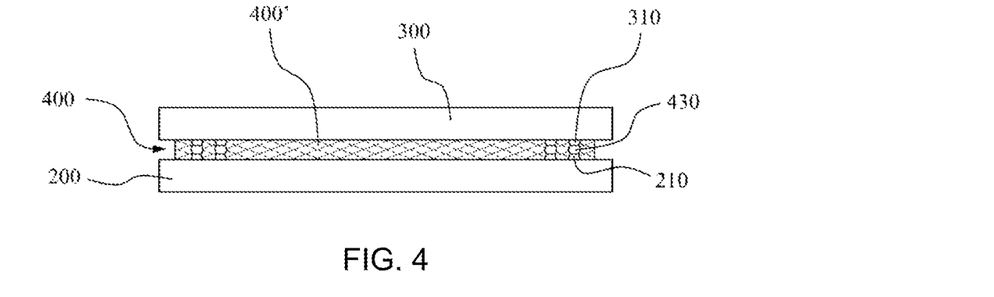
FIG. 4 is a cross-sectional view of the display panel of the present invention taken along a line A-A of FIG. 1.

Referring to FIG. 4, which is a cross-sectional view of the display panel 100 of the present invention taken along a line A-A of FIG. 1. The display panel 100 of the present invention further includes an adhering layer 400. The adhering layer 400 adheres between the driving substrate 200 and the display substrate 300, and is configured to adhere the driving substrate 200 and the display substrate 300 in the daughter-mother board splicing technology. The adhering layer 400 includes an adhesive 400' and a conductive glue 430. In the adhering layer 400, the adhesive 400' adheres surfaces of the driving substrate 200 and the display substrate 300 facing each other. In addition, the conductive glue 430 of the adhering layer 400 is electrically connected to the first bonding electrode 210 of the driving substrate 200 and the second bonding electrode 310 of the display substrate 300, so as to form the driving circuit of the display panel 100.

In the daughter-mother board splicing technology, a surface where the second bonding electrode 310 of the display substrate 300 is positioned is directed toward the first bonding electrode 210 of the driving substrate 200 and pressed through a pressing device. In this way, the first bonding electrode 210 of the driving substrate 200 is electrically connected to the second bonding electrode 310 of the display substrate 300, and the adhesive 400' adheres the driving substrate 200 and the display substrate 300 without a gap.

Figure 5:
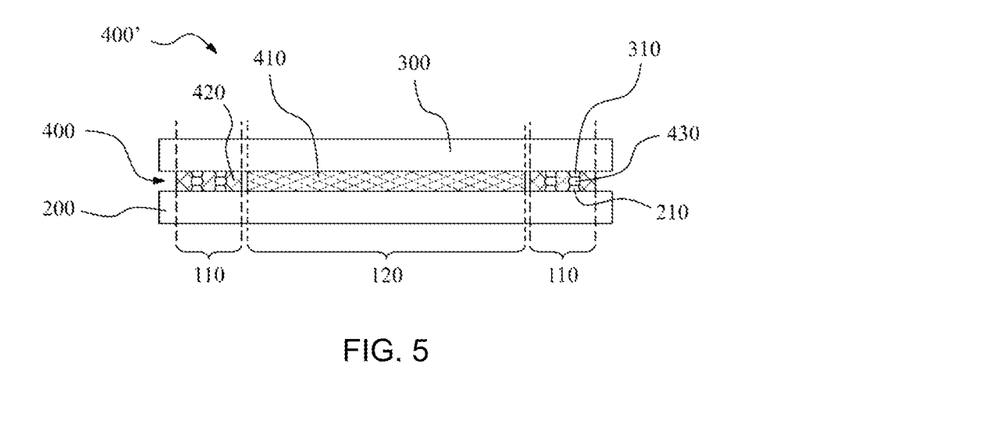
FIG. 5 is another cross-sectional view of the display panel of the present invention taken along the line A-A of FIG. 1.

Referring to FIG. 5, which is another cross-sectional view of the display panel 100 of the present invention taken along the line A-A of FIG. 1. A difference between this embodiment and a structure shown in FIG. 4 is that the glue 400' of the adhering layer 400 includes a first adhesive 410 and a second adhesive 420. In the adhering layer 400, the first adhesive 410 is positioned in the non-bonding region 120 of the display panel 100, and the second adhesive 420 is positioned in the bonding region 110 of the display panel 100. A material or a configuration of the first adhesive 410 and the second adhesive 420 can be adjusted adaptively according to manufacturing requirements of the display panel 100.

Compared with a display panel in the prior art that only adhere the driving substrate and the display substrate by the conductive glue, the first adhesive 410 and the second adhesive 420 of the adhesive 400' of the display panel 100 of the present invention are fully filled between the driving substrate 200 and the display substrate 300, i.e., no cavity with air exists between the driving substrate 200 and the display substrate 300. Since there is no air between the driving substrate 200 and the display substrate 300, the display panel 100 is not affected by partial cracks caused by thermal expansion or thermal contraction of the air or an open circuit of the driving circuit. Therefore, the first adhesive 410 and the second adhesive 420 of the present invention are fully filled in the cavity between the driving substrate 200 and the display substrate 300, enhance an adhesiveness between the driving substrate 200 and the display substrate 300, and further increases a reliability of the display panel 100 and prolongs a service life of the display panel 100.

The present invention will be described in detail as follows based on different structures and materials of each element in the display panel 100.

Specifically, the adhering layer 400 will be described in detail with labeled 401, 402, 403, 404, 405, and 406 respectively in first to sixth embodiments; the first adhesive 410 will be described in detail with labeled 411, 412, 413, 414, 415, and 416 respectively in first to sixth embodiments; and the second adhesive 420 will be described in detail with labeled 421, 422, 423, 424, 425, and 426 respectively in first to sixth embodiments.

First Embodiment

Figure 6:
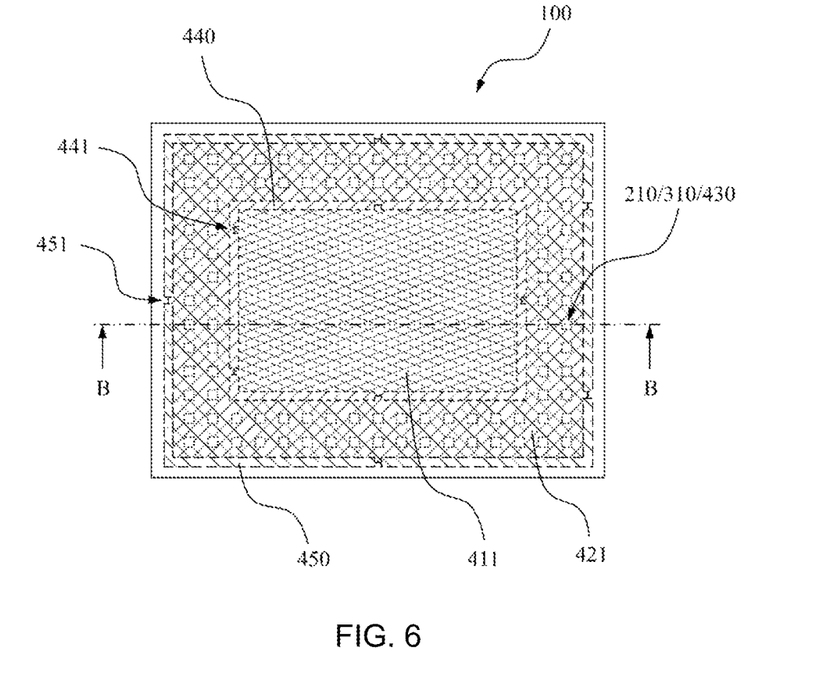
FIG. 6 is a top view of the display panel in a first embodiment of the present invention.
Figure 7:
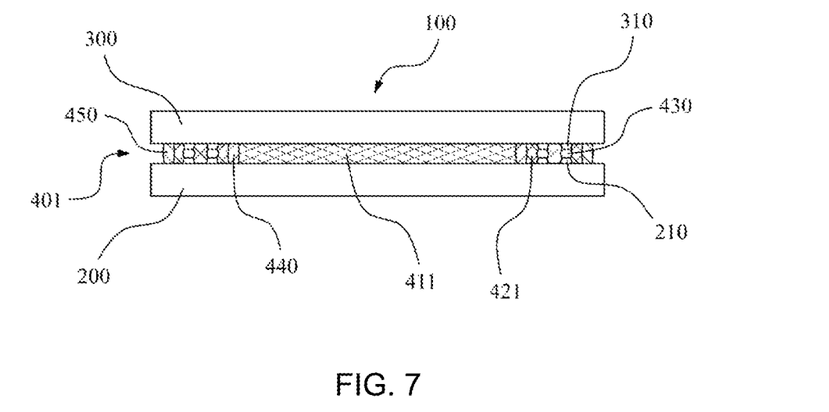
FIG. 7 is a cross-sectional view of the display panel of the present invention taken along a line B-B of FIG. 6.

Referring to FIGS. 6-7, FIG. 6 is a top view of the display panel 100 of the present invention in a first embodiment, FIG. 7 is a cross-sectional view of the display panel 100 of the present invention taken along a line B-B of FIG. 6, and are to be read in conjunction with FIG. 1. It should be noted that, in the top view of the display panel 100 in FIG. 6, components inside the display panel 100 are drawn with dotted lines to assist in describing this embodiment.

In this embodiment, for requirements of specific processes, a material of the first adhesive 411 positioned in the non-bonding region 120 of the display panel 100 includes a liquid adhesive, and a material of a second adhesive 421 in the bonding region 110 of the display panel 100 includes a liquid adhesive. For example, the liquid adhesive includes optical clear resin (OCR), which is initially liquid and can be shaped through light curing or dry curing.

Since the first adhesive 411 and the second adhesive 421 are made of the liquid adhesive with good fluidity, which can fill gaps on a surface where the first bonding electrode 210 of the driving substrate 200 is positioned, fill gaps on the surface where the second bonding electrode 310 of the display substrate 300 is positioned, and can flow autonomously among a plurality of the first bonding electrodes 210 and a plurality of the second bonding electrodes 310.

In order to confine the first adhesive 411 with high fluidity in the non-bonding region 120 and confine the second adhesive 421 with high fluidity in the bonding region 110, the adhering layer 401 further includes a first surrounding dam 440 and a second surrounding dam 450. The first surrounding dam 440 surrounds an outer periphery of the non-bonding region 120. The second surrounding dam 450 surrounds an outer periphery of the bonding region 110.

Materials of the first surrounding dam 440 and the second surrounding dam 450 include optical clear resin, photocurable ink, polystyrene, optical clear adhesive (OCA), or anisotropic conductive film (ACF). In this embodiment, the above-mentioned materials are formed on the surface where the first bonding electrode 210 of the driving substrate 200 is positioned according to a designated position by a spraying or a dispensing process.

After the first surrounding dam 440 and the second surrounding dam 450 are formed, the first adhesive 411 is applied to a region surrounded by the first surrounding dam 440 on the surface where the first bonding electrode 210 of the driving substrate 200 is positioned, and the second adhesive 421 is applied to a region surrounded by the second surrounding dam 450 and the first surrounding dam 440 on the surface where the first bonding electrode 210 of the driving substrate 200 is positioned. In addition, the conductive glue 430 is applied to the second bonding electrode 310 of the display substrate 300. Lastly, an adhering layer 401 composed of the first adhesive 411, the second adhesive 421, the conductive glue 430, the first surrounding dam 440, and the second surrounding dam 450 adheres the driving substrate 200 and the display substrate 300.

In this embodiment, the first surrounding dam 440 and the second surrounding dam 450 also have a function of maintaining a distance between the driving substrate 200 and the display substrate 300. Considering an overall thickness of the first bonding electrode 210 of the driving substrate 200, the second bonding electrode 310 of the display substrate 300, and the conductive glue 430, a thickness of the first surrounding dam 440 and the second surrounding dam 450 ranges from 0.1 millimeters to 0.5 millimeters, and preferably set to be 0.2 millimeters. In addition, for a stability of the first surrounding dam 440 and the second surrounding dam 450, a width of the first surrounding dam 440 and the second surrounding dam 450 ranges from 0.1 millimeters to 1 millimeters, and preferably set to be 0.5 millimeters.

Considering that during a pressing process of the driving substrate 200 and the display substrate 300, the air can be confined to the driving substrate 200 and the display substrate 300 along with the first adhesive 411 the second adhesive 421, in this embodiment, the first surrounding dam 440 is defined with a first vent 441, and the second surrounding dam 450 is defined with a second vent 451. Therefore, when the display substrate 300 is being pressed to the driving substrate 200, the air between the driving substrate 200 and the display substrate 300 is exhausted through the first vent 441 and the second vent 451, effectively assisting a manufacturing of the display panel 100 of the present invention. The first vent 441 and the second vent 451 can be single or multiple. Positions of the first vent 441 and the second vent 451 on the first surrounding dam 440 and the second surrounding dam 450 are not limited to the positions shown in FIG. 6, and can be arranged in corners, symmetrical, asymmetrical, or randomly. In addition, the positions of the first vent 441 and the second vent 451 of the first surrounding dam 440 and the second surrounding dam 450 can also be arranged according to a pressing direction of the driving substrate 200 and the display substrate 300.

In addition, it should be noted that, due to an arrangement of the second vent 451, during a manufacturing process of the display panel 100, the second adhesive 421 can also flow through the second vent 451 and then be injected among the driving substrate 200, the display substrate 300, the first surrounding dam 440, and the second surrounding dam 450 after the driving substrate 200 and the display substrate 300 are pressed together.

Second Embodiment

Figure 8:
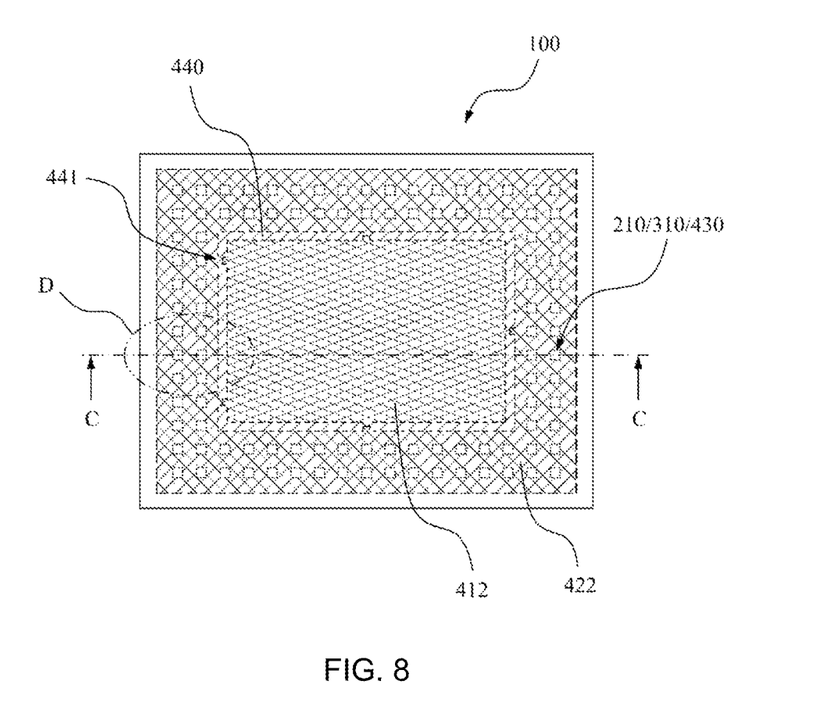
FIG. 8 is a top view of the display panel in a second embodiment of the present invention.
Figure 9:
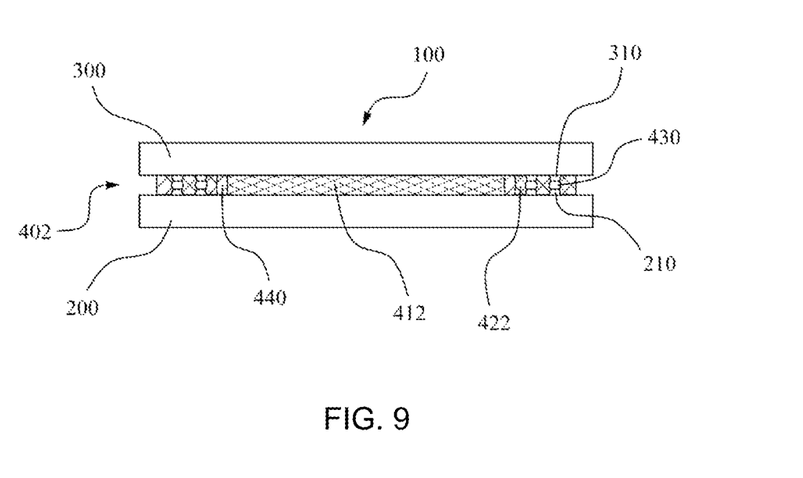
FIG. 9 is a cross-sectional view of the display panel of the present invention taken along a line C-C of FIG. 8.

Referring to FIGS. 8-9, FIG. 8 is a top view of the display panel 100 of the present invention in a second embodiment, FIG. 9 is a cross-sectional view of the display panel 100 of the present invention taken along a line C-C of FIG. 8, and are to be read in conjunction with FIG. 1. It should be noted that, in the top view of the display panel 100 in FIG. 8, components inside the display panel 100 are drawn with dotted lines to assist in describing this embodiment.

In this embodiment, for requirements of specific processes, a material of a first adhesive 412 positioned in the non-bonding region 120 of the display panel 100 includes the liquid adhesive described in the foregoing embodiment, and a material of a second adhesive 422 positioned in the bonding region 110 of the display panel 100 includes the solid adhesive. For example, the solid adhesive includes an acrylic tape, a silicone tape, or an optical clear adhesive.

The first adhesive 412 adopts the liquid adhesive described in the foregoing embodiment, and technical effects thereof will not be reiterated herein. Since the second adhesive 422 adopts the solid adhesive, the second adhesive 422 can be quickly attached to the surface where the first bonding electrode 210 of the driving substrate 200 is positioned or the surface where the second bonding electrode 310 of the display substrate 300 is positioned, so that the manufacturing process of the display panel 100 can be adjusted flexibly. For example, when the second adhesive 422 that adopts the solid adhesive is attached to the display substrate 300, it can be prepared with the first adhesive 412 applied to the driving substrate 200 which adopts the liquid adhesive simultaneously in two parallel manufacturing processes to shorten an overall manufacturing time of the display panel 100.

In order to confine the first adhesive 412 with high fluidity to the non-bonding region 120, the adhering layer 402 further includes the first surrounding dam 440. The first surrounding dam 440 surrounds the outer periphery of the non-bonding region 120.

The material of the first surrounding dam 440 includes optical clear resin, photocurable ink, polystyrene, optical clear adhesive, or anisotropic conductive film described in the foregoing embodiment. In this embodiment, the above-mentioned materials are formed on the surface where the first bonding electrode 210 of the driving substrate 200 is positioned according to a designated position by a spraying or a dispensing process.

After the first surrounding dam 440 is formed, the first adhesive 412 is applied to a region surrounded by the first surrounding dam 440 on the surface where the first bonding electrode 210 of the driving substrate 200 is positioned. The second adhesive 422 and the conductive glue 430 arranged in a same layer are attached to the bonding region 110 on the surface where the first bonding electrode 210 of the driving substrate 200 is positioned, or the second adhesive 422 and the conductive glue 430 arranged in the same layer are attached to the bonding region 110 on the surface where the second bonding electrode 310 of the display substrate 300 is positioned. Lastly, an adhering layer 402 composed of the first adhesive 412, the second adhesive 422, the conductive glue 430, and the first surrounding dam 440 adheres the driving substrate 200 and the display substrate 300.

In this embodiment, the first surrounding dam 440 and the second adhesive 422 also have a function of maintaining the distance between the driving substrate 200 and the display substrate 300. Considering the overall thickness of the first bonding electrode 210 of the driving substrate 200, the second bonding electrode 310 of the display substrate 300, and the conductive glue 430, the thickness of the first surrounding dam 440 ranges from 0.1 millimeters to 0.5 millimeters, and a thickness of the second adhesive 422 ranges from 0.1 millimeters to 0.5 millimeters, and preferably set to be 0.2 millimeters. In addition, for the stability of the first surrounding dam 440, the width of the first surrounding dam 440 ranges from 0.1 millimeters to 1 millimeters, and preferably set to be 0.5 millimeters.

Considering that during the pressing process of the driving substrate 200 and the display substrate 300, the air can be confined to the driving substrate 200 and the display substrate 300 along with the first adhesive 412, in this embodiment, the first surrounding dam 440 is defined with the first vent 441. Therefore, when the display substrate 300 is being pressed to the driving substrate 200, the air between the driving substrate 200 and the display substrate 300 is exhausted through the first vent 441, effectively assisting the manufacturing of the display panel 100 of the present invention. The first vent 441 can be single or multiple. The positions of the first vent 441 on the first surrounding dam 440 are not limited to the positions shown in FIG. 8, and can be arranged in corners, symmetrical, asymmetrical, or randomly. In addition, the positions of the first vent 441 of the first surrounding dam 440 can also be arranged according to the pressing direction of the driving substrate 200 and the display substrate 300.

Figure 10:
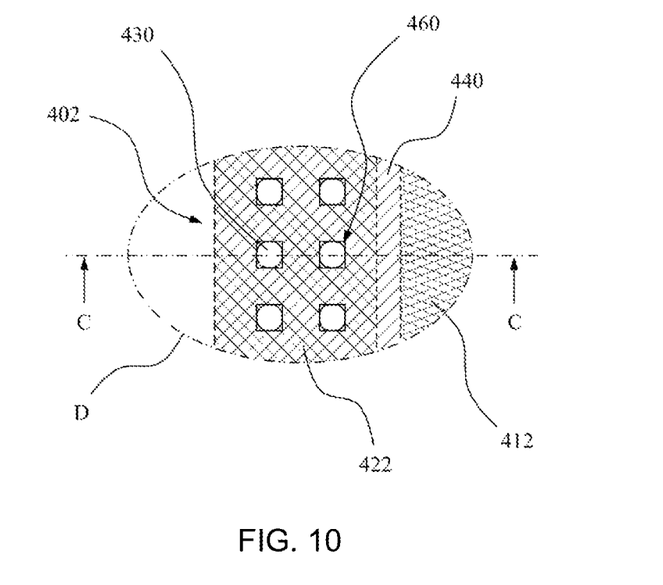
FIG. 10 is a partial view D of an adhering layer of the display panel of the present invention in FIG. 8.
Figure 11:
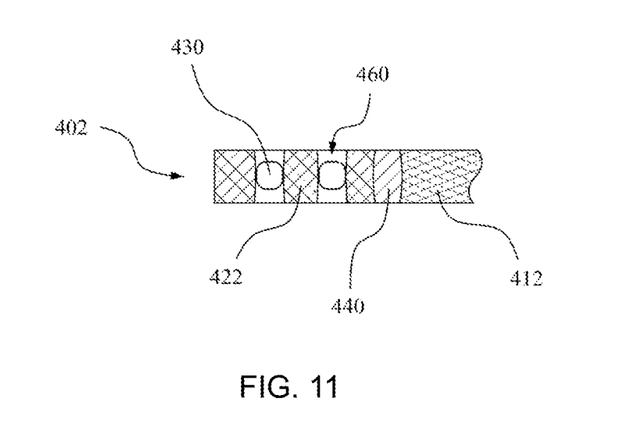
FIG. 11 is a cross-sectional view of the adhering layer of the display panel of the present invention taken along a line C-C of FIG. 10.

Referring to FIGS. 10-11, FIG. 10 is a partial view D of the adhering layer 402 of the display panel 100 in FIG. 8, and FIG. 11 is a partial cross-sectional view taken along the line C-C of FIG. 10. It should be noted that, since the second adhesive 422 in this embodiment adopts the solid adhesive, it is disposed between the driving substrate 200 and the display substrate 300 in a form of a whole piece of adhesive film. The first bonding electrode 210 of the driving substrate 200 and the second bonding electrode 310 of the display substrate 300 are blocked by the second adhesive 422 and cannot be electrically connected through the conductive glue 430. Therefore, after the second adhesive 422 is attached to the surface where the first bonding electrode 210 of the driving substrate 200 is positioned, or attached to the surface where the second bonding electrode 310 of the display substrate 300 is positioned, the second adhesive 422 is defined with a through hole 460 through laser in a region of the second adhesive 422 corresponding to the first bonding electrode 210 and the second bonding electrode 310. The through hole 460 is filled with the conductive glue 430 and provides a space for the first bonding electrode 210 and the second bonding electrode 310 to electrically connect.

Third Embodiment

Figure 12:
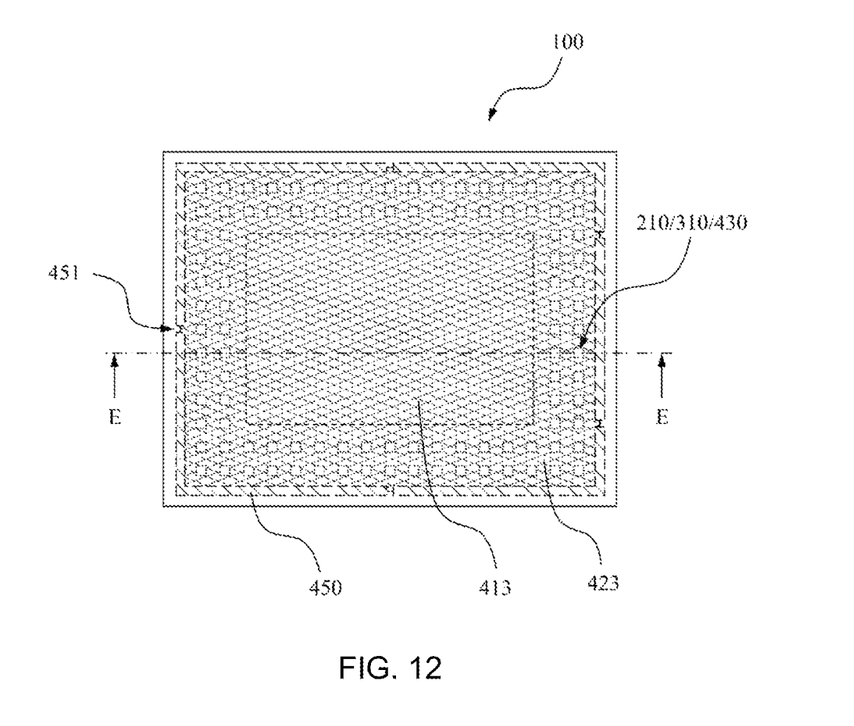
FIG. 12 is a top view of the display panel in a third embodiment of the present invention.
Figure 13:
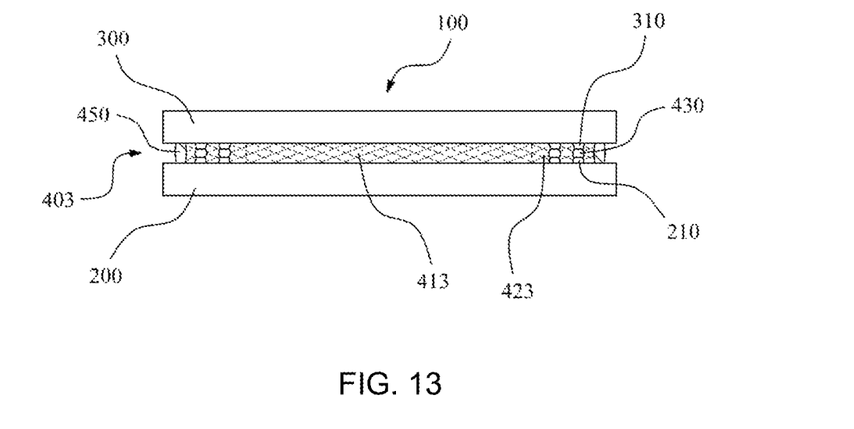
FIG. 13 is a cross-sectional view of the display panel of the present invention taken along a line E-E of FIG. 12.

Referring to FIGS. 12-13, FIG. 12 is a top view of the display panel 100 of the present invention in the third embodiment, FIG. 13 is a cross-sectional view of the display panel 100 of the present invention taken along a line E-E of FIG. 12, and are to be read in conjunction with FIG. 1. It should be noted that, in the top view of the display panel 100 in FIG. 12, components inside the display panel 100 are drawn with dotted lines to assist in describing this embodiment.

In this embodiment, for requirements of specific processes, a material of a first adhesive 413 positioned in the non-bonding region 120 of the display panel 100 includes the liquid adhesive described in the foregoing embodiment, and a material of a second adhesive 423 positioned in the bonding region 110 of the display panel 100 includes the liquid adhesive described in the foregoing embodiment.

Compared with the first embodiment, in this embodiment, in order to simplify the manufacturing process, the first adhesive 413 and the second adhesive 423 are formed integrally. That is, the first adhesive 413 and the second adhesive 423 adopt the same liquid adhesive. The first adhesive 413 and the second adhesive 423 adopt the liquid adhesive described in the foregoing embodiment, and technical effects thereof will not be reiterated herein.

In order to confine the first adhesive 413 and the second adhesive 423 with high fluidity to the non-bonding region 120 and the bonding region 110, the adhering layer 403 further includes the second surrounding dam 450. The second surrounding dam 450 surrounds the outer periphery of the bonding region 110.

A material of the second surrounding dam 450 includes optical clear resin, photocurable ink, polystyrene, optical clear adhesive, or anisotropic conductive film described in the foregoing embodiment. In this embodiment, the above-mentioned materials are formed on the surface where the first bonding electrode 210 of the driving substrate 200 is positioned according to a designated position by a spraying or a dispensing process.

After the second surrounding dam 450 is formed, the first adhesive 413 and the second adhesive 423 are integrally applied to a region surrounded by the second surrounding dam 450 on the surface where the first bonding electrode 210 of the driving substrate 200 is positioned. At the same time, the conductive glue 430 is applied to the second bonding electrode 310 of the display substrate 300. Lastly, an adhering layer 403 composed of the first adhesive 413, the second adhesive 423, the conductive glue 430, and the second surrounding dam 450 adheres the driving substrate 200 and the display substrate 300.

In this embodiment, the second surrounding dam 450 also has the function of maintaining the distance between the driving substrate 200 and the display substrate 300. Considering the overall thickness of the first bonding electrode 210 of the driving substrate 200, the second bonding electrode 310 of the display substrate 300, and the conductive glue 430, a thickness of the second surrounding dam 450 ranges from 0.1 millimeters to 0.5 millimeters, and preferably set to be 0.2 millimeters. In addition, for a stability of the second surrounding dam 450, the width of the second surrounding dam 450 ranges from 0.1 millimeters to 1 millimeters, and preferably set to be 0.5 millimeters.

Considering that during the pressing process of the driving substrate 200 and the display substrate 300, the air can be confined to the driving substrate 200 and the display substrate 300 along with the first adhesive 413 the second adhesive 423, in this embodiment, and the second surrounding dam 450 is defined with the second vent 451. Therefore, when the display substrate 300 is being pressed to the driving substrate 200, the air between the driving substrate 200 and the display substrate 300 is exhausted through the second vent 451, effectively assisting the manufacturing of the display panel 100 of the present invention. The second vent 451 can be single or multiple. The positions of the second vent 451 on the second surrounding dam 450 are not limited to the positions shown in FIG. 12, and can be arranged in corners, symmetrical, asymmetrical, or randomly. In addition, the positions of the second vent 451 of the second surrounding dam 450 can also be arranged according to the pressing direction of the driving substrate 200 and the display substrate 300.

In addition, it should be noted that, due to the arrangement of the second vent 451, during the manufacturing process of the display panel 100, the first adhesive 413 and the second adhesive 423 made of a same material can also flow through the second vent 451 and then be injected among the driving substrate 200, the display substrate 300, the first surrounding dam 440, and the second surrounding dam 450 after the driving substrate 200 and the display substrate 300 are pressed together.

Fourth Embodiment

Figure 14:
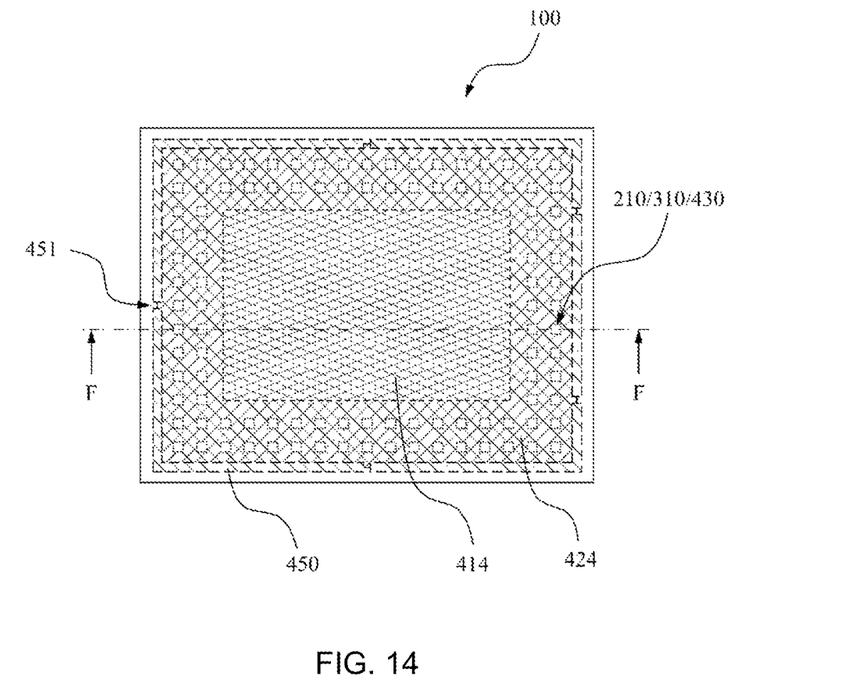
FIG. 14 is a top view of the display panel in a fourth embodiment of the present invention.
Figure 15:
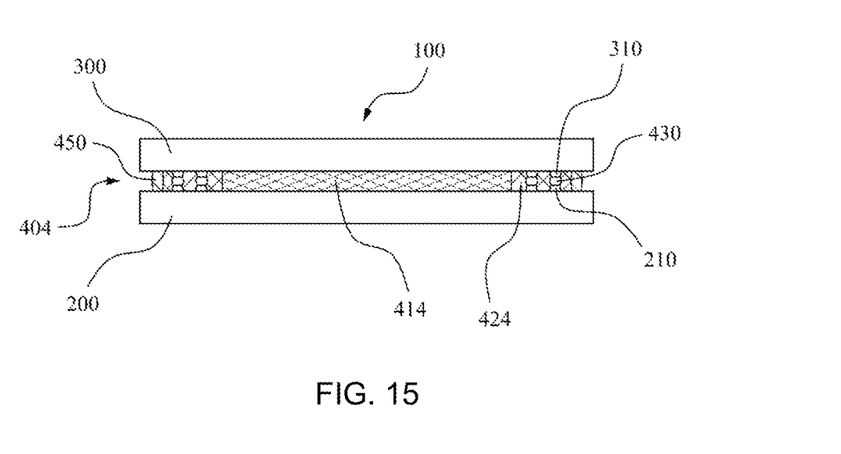
FIG. 15 is a cross-sectional view of the display panel of the present invention taken along a line F-F of FIG. 14.

Referring to FIGS. 14-15, FIG. 14 is a top view of the display panel 100 of the present invention in the fourth embodiment, FIG. 15 is a cross-sectional view of the display panel 100 of the present invention taken along a line F-F of FIG. 14, and are to be read in conjunction with FIG. 1. It should be noted that, in the top view of the display panel 100 in FIG. 14, components inside the display panel 100 are drawn with dotted lines to assist in describing this embodiment.

In this embodiment, for requirements of specific processes, a material of a first adhesive 414 positioned in the non-bonding region 120 of the display panel 100 includes the solid adhesive described in the foregoing embodiment, and a material of a second adhesive 424 positioned in the bonding region 110 of the display panel 100 includes the liquid adhesive described in the foregoing embodiment.

Compared with the first embodiment, in this embodiment, in order to simplify the manufacturing process, the first adhesive 411 including the liquid adhesive in the non-bonding region 120 of the display panel 100 is replaced with the first adhesive 414 including the solid adhesive. In this way, the manufacturing process of the display panel 100 can omit the manufacturing process of the first surrounding dam 440 in the first embodiment. The first adhesive 414 adopts the solid adhesive described in the previous embodiment, and the second adhesive 424 adopts the liquid adhesive described in the previous embodiment, technical effects thereof will not be reiterated herein.

In order to confine the second adhesive 424 with high fluidity in the bonding region 110, the adhering layer 404 further includes the second surrounding dam 450. The second surrounding dam 450 surrounds the outer periphery of the bonding region 110.

The material of the second surrounding dam 450 includes optical clear resin, photocurable ink, polystyrene, optical clear adhesive, or anisotropic conductive film described in the foregoing embodiment. In this embodiment, the above-mentioned materials are formed on the surface where the first bonding electrode 210 of the driving substrate 200 is positioned according to a designated position by a spraying or a dispensing process.

After the second surrounding dam 450 is formed, the first adhesive 414 is attached to the non-bonding region 120 on the surface where the first bonding electrode 210 of the driving substrate 200 is positioned, and the second adhesive 424 is applied to a region surrounded by the second surrounding dam 450 and the first adhesive 414 on the surface where the first bonding electrode 210 of the driving substrate 200 is positioned. At the same time, the conductive glue 430 is applied to the second bonding electrode 310 of the display substrate 300. Lastly, an adhering layer 404 composed of the first adhesive 414, the second adhesive 424, the conductive glue 430, and the second surrounding dam 450 adheres the driving substrate 200 and the display substrate 300.

In this embodiment, the first adhesive 414 and the second surrounding dam 450 also have the function of maintaining the distance between the driving substrate 200 and the display substrate 300. Considering the overall thickness of the first bonding electrode 210 of the driving substrate 200, the second bonding electrode 310 of the display substrate 300, and the conductive glue 430, a thickness of the first adhesive 414 ranges from 0.1 millimeters to 0.5 millimeters, and the thickness of the second surrounding dam 450 ranges from 0.1 millimeters and 0.5 millimeters, preferably set to be 0.2 millimeters. At the same time, for the stability of the second surrounding dam 450, the width of the second surrounding dam 450 ranges from 0.1 to 1 millimeters, and preferably set to be 0.5 millimeters.

Considering that during the pressing process of the driving substrate 200 and the display substrate 300, the air can be confined to the driving substrate 200 and the display substrate 300 along with the first adhesive 414, in this embodiment, and the second surrounding dam 450 is defined with the second vent 451. Therefore, when the display substrate 300 is being pressed to the driving substrate 200, the air between the driving substrate 200 and the display substrate 300 is exhausted through the second vent 451, effectively assisting the manufacturing of the display panel 100 of the present invention. The second vent 451 can be single or multiple. The positions of the second vent 451 on the second surrounding dam 450 are not limited to the positions shown in FIG. 14, and can be arranged in corners, symmetrical, asymmetrical, or randomly. In addition, the positions of the second vent 451 of the second surrounding dam 450 can also be arranged according to the pressing direction of the driving substrate 200 and the display substrate 300.

In addition, it should be noted that, due to the arrangement of the second vent 451, during the manufacturing process of the display panel 100, the first adhesive 414 and the second adhesive 424 made of the same material can also flow through the second vent 451 and then be injected among the driving substrate 200, the display substrate 300, the first surrounding dam 440, and the second surrounding dam 450 after the driving substrate 200 and the display substrate 300 are pressed together.

Fifth Embodiment

Figure 16:
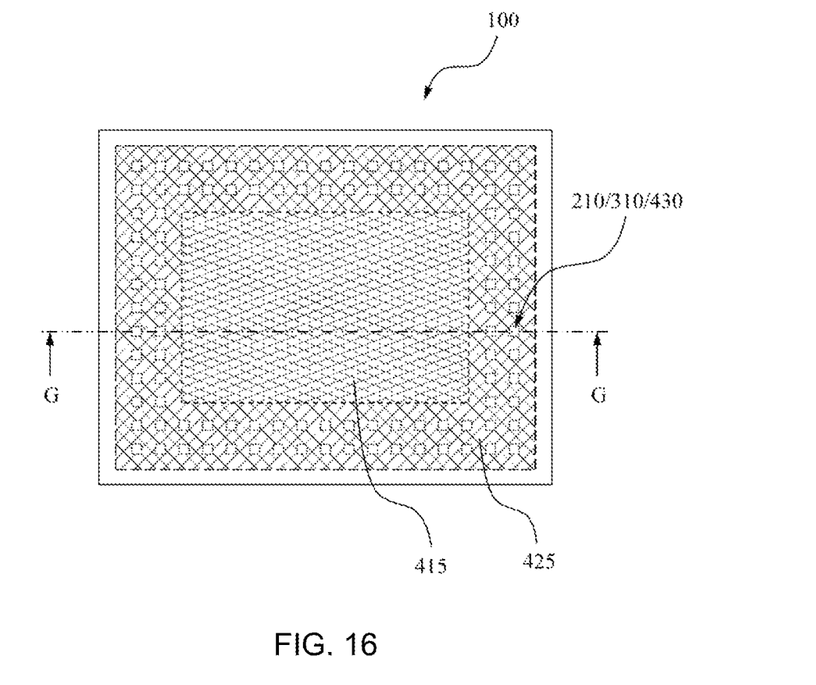
FIG. 16 is a top view of the display panel in a fifth embodiment of the present invention.
Figure 17:
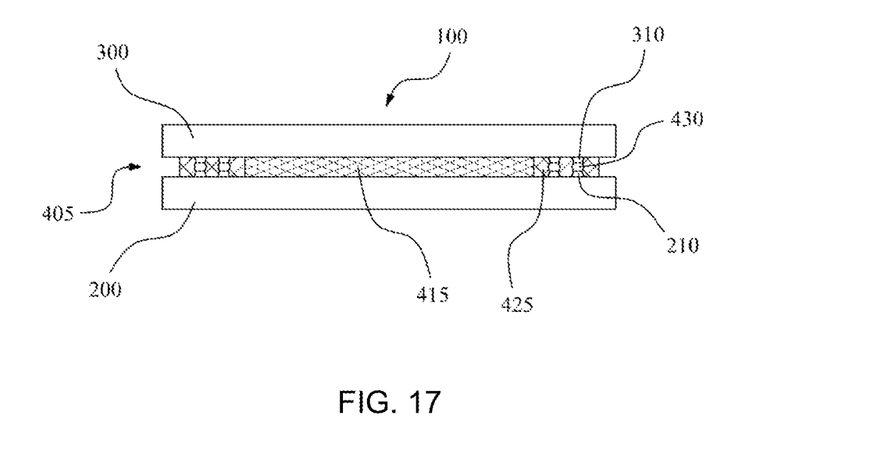
FIG. 17 is a cross-sectional view of the display panel of the present invention taken along a line G-G of FIG. 16.

Referring to FIGS. 16-17, FIG. 16 is a top view of the display panel 100 of the present invention in a fifth embodiment, FIG. 17 is a cross-sectional view of the display panel 100 of the present invention taken along a line G-G of FIG. 16, and is to be read in conjunction with FIG. 1. It should be noted that, in the top view of the display panel 100 in FIG. 16, components inside the display panel 100 are drawn with dotted lines to assist in describing this embodiment.

In this embodiment, for requirements of specific processes, a material of a first adhesive 415 positioned in the non-bonding region 120 of the display panel 100 includes the solid adhesive described in the foregoing embodiment and a material of a second adhesive 425 positioned in the bonding region 110 of the display panel 100 includes the solid adhesive described in the foregoing embodiment.

Compared with the fourth embodiment, in this embodiment, in order to simplify the manufacturing process, the second adhesive 424 including the liquid adhesive in the bonding region 120 of the display panel 100 is replaced with the second adhesive 425 including the solid adhesive. In this way, the manufacturing process of the display panel 100 can omit the manufacturing process of the second surrounding dam 450 in the fourth embodiment. The first adhesive 415 adopts the solid adhesive described in the foregoing embodiment, and the second adhesive 425 adopts the solid adhesive described in the foregoing embodiment, technical effects thereof will not be reiterated herein.

The first adhesive 415 is attached to the non-bonding region 120 on the surface where the first bonding electrode 210 of the driving substrate 200 is positioned, or attached to the non-bonding region 120 on the surface where the second bonding electrode 310 of the display substrate 300 is positioned. The second adhesive 425 and the conductive glue 430 arranged in a same layer are attached to the bonding region 110 on the surface where the first bonding electrode 210 of the driving substrate 200 is positioned, or attached to the bonding region 110 on the surface where the second bonding electrode 310 of the display substrate 300 is positioned along with the conductive glue 430 in the same layer. Lastly, the adhering layer 405 composed of the first adhesive 415, the second adhesive 425, and the conductive glue 430 adheres the driving substrate 200 and the display substrate 300.

In this embodiment, the first adhesive 415 and the second adhesive 425 also have the function of maintaining the distance between the driving substrate 200 and the display substrate 300. Considering the overall thickness of the first bonding electrode 210 of the driving substrate 200, the second bonding electrode 310 of the display substrate 300, and the conductive glue 430, the thickness of the first adhesive 415 and the second adhesive 425 ranges from 0.1 millimeters to 0.5 millimeters, and preferably set to be 0.2 millimeters.

It should be noted that, since the second adhesive 425 of this embodiment adopts the solid adhesive, which is provided between the driving substrate 200 and the display substrate 300 in the form of a whole piece of adhesive film, further defining a through hole through laser in a region of the second adhesive 425 corresponding to the first bonding electrode 210 and the second bonding electrode 310. The through hole is filled with the conductive glue 430 and provides a space for the first bonding electrode 210 and the second bonding electrode 310 to electrically connect. A specific opening method has been described in the foregoing embodiment, and will not be reiterated herein.

Sixth Embodiment

Figure 18:
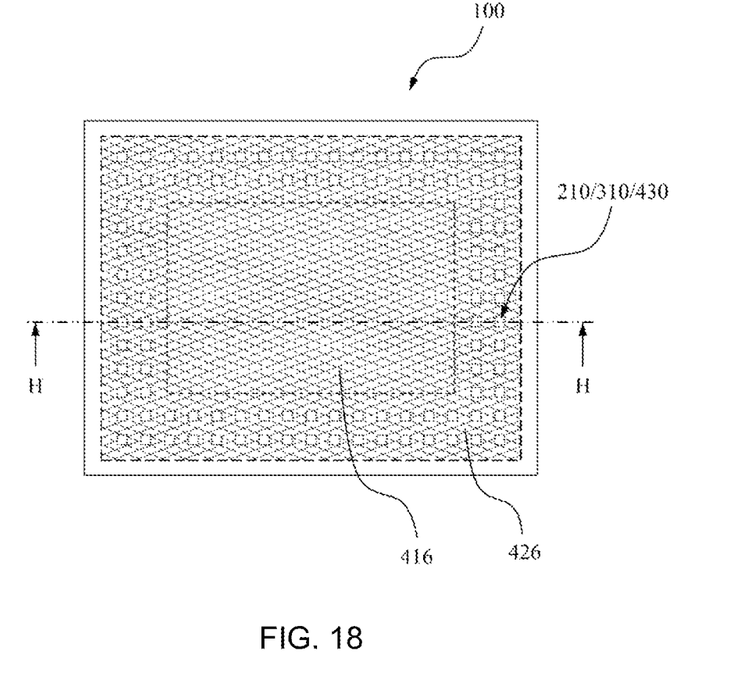
FIG. 18 is a top view of the display panel in a sixth embodiment of the present invention.
Figure 19:
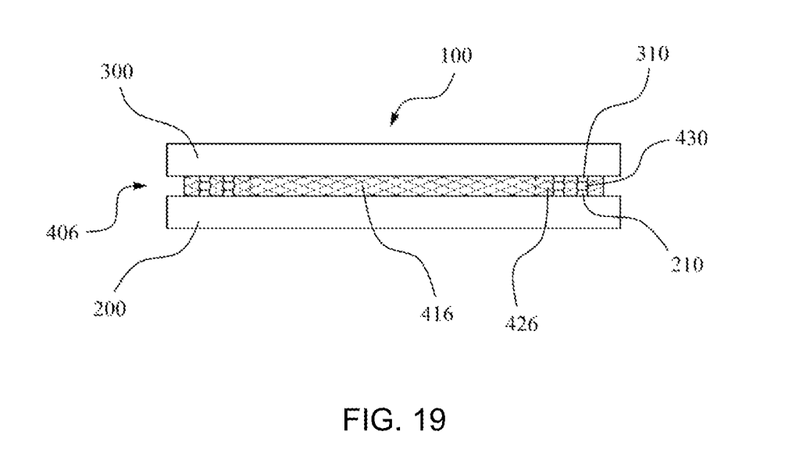
FIG. 19 is a cross-sectional view of the display panel of the present invention taken along a line H-H of FIG. 18.

Referring to FIGS. 18 and 19, FIG. 18 is a top view of the display panel 100 of the present invention in a sixth embodiment, FIG. 19 is a cross-sectional view of the display panel 100 of the present invention taken along a line H-H of FIG. 18, and are to be read in conjunction with FIG. 1. It should be noted that, in the top view of the display panel 100 in FIG. 18, components inside the display panel 100 are drawn with dotted lines to assist in describing this embodiment.

In this embodiment, for requirements of specific processes, a material of a first adhesive 416 positioned in the non-bonding region 120 of the display panel 100 includes the solid adhesive described in the foregoing embodiment and a material of a second adhesive 426 positioned in the bonding region 110 of the display panel 100 includes the solid adhesive described in the foregoing embodiment.

Compared with the fifth embodiment, in this embodiment, in order to simplify the manufacturing process, the first adhesive 416 and the second adhesive 426 are formed integrally. That is, the first adhesive 416 and the second adhesive 426 adopts a same solid adhesive. The first adhesive 416 and the second adhesive 426 adopt the solid adhesive described in the foregoing embodiment, and technical effects thereof will not be reiterated herein.

The first adhesive 416 and the second adhesive 426 are integrally attached to the non-bonding region 120 of the surface where the first bonding electrode 210 of the driving substrate 200 is positioned, or attached to the non-bonding region 120 of the surface where the second bonding electrode 310 of the display substrate 300 is positioned, along with the conductive glue 430 arranged in a same layer. Lastly, the adhering layer 406 composed of the first adhesive 416, the second adhesive 426, and the conductive glue 430 adheres the driving substrate 200 and the display substrate 300.

In this embodiment, the first adhesive 416 and the second adhesive 426 also have the function of maintaining the distance between the driving substrate 200 and the display substrate 300. Considering the overall thickness of the first bonding electrode 210 of the driving substrate 200, the second bonding electrode 310 of the display substrate 300, and the conductive glue 430, the thickness of the first adhesive 416 and the second adhesive 426 ranges from 0.1 millimeters to 0.5 millimeters, and preferably set to be 0.2 millimeters.

It should be noted that, since the second adhesive 426 of this embodiment adopts the solid adhesive, which is provided between the driving substrate 200 and the display substrate 300 in the form of a whole piece of adhesive film, further defining a through hole through laser in a region of the second adhesive 426 corresponding to the first bonding electrode 210 and the second bonding electrode 310. The through hole is filled with the conductive glue 430 and provides a space for the first bonding electrode 210 and the second bonding electrode 310 to electrically connect. The specific opening method has been described in the foregoing embodiment, and will not be reiterated herein.

Seventh Embodiment

Figure 20:
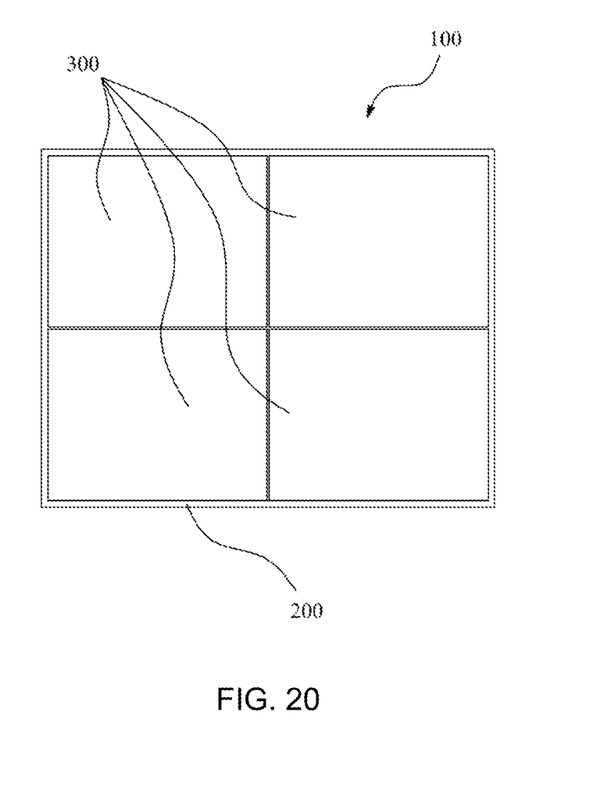
FIG. 20 is a top view of another display panel of the present invention.

Referring to FIG. 20, which is a top view of another display panel 100 of the present invention. In the display panel 100 applied to the daughter-mother board splicing technology, the display panel 100 can further include a plurality of display substrates 300.

In this embodiment, the display substrates 300 are arranged in an array on the driving substrate 200 according to structures or manufacturing processes described in any of the foregoing embodiments, and are electrically connected to the driving substrate 200 to form the driving circuit. In addition to increasing the reliability and prolonging the service life of the display panel 100, the display panel 100 of a larger size can be obtained by splicing the display substrates 300.

The description above are only preferred embodiments of the invention. It should be pointed out that to those of ordinary skill in the art, various improvements and embellishments may be made without departing from the principle of the present invention, and these improvements and embellishments are also deemed to be within the scope of protection of the present invention.

What is claimed is:

1. A display panel, comprising:
   a driving substrate, comprising a first bonding electrode and a driving circuit of the display panel;
   a display substrate, comprising a second bonding electrode and a display unit of the display panel, wherein the second bonding electrode corresponds to the first bonding electrode of the driving substrate; and
   an adhering layer, disposed between the driving substrate and the display substrate and comprising a conductive glue and an adhesive, wherein the conductive glue electrically connects the first bonding electrode of the driving substrate and the second bonding electrode of the display substrate to enable the driving circuit to electrically connect the display unit, and the adhesive adheres surfaces of the driving substrate and the display substrate facing each other; and
   wherein the display panel comprises a plurality of display substrates arranged in an array on the driving substrate, and each of the plurality of display substrates is arranged as the said display substrate.

2. The display panel according to claim 1, wherein the adhesive has a liquid state during a manufacturing process of the display panel and has a solid state after the display panel is manufactured; and
   the adhering layer further comprises a surrounding dam, the surrounding dam surrounds an outer periphery of the adhesive, and the adhesive is filled among the driving substrate, the display substrate, and the surrounding dam.

3. The display panel according to claim 2, wherein the surrounding dam is defined with a vent.

4. The display panel according to claim 2, wherein the adhesive is shaped from the liquid state to the solid state through light curing.

5. The display panel according to claim 2, wherein the display panel comprises a bonding region and a non-bonding region, and the bonding region surrounds the non-bonding region;
   the first bonding electrode of the driving substrate and the second bonding electrode of the display substrate are positioned at the bonding region of the display panel; and
   the adhesive of the adhering layer comprises a first adhesive and a second adhesive, and the first adhesive is positioned at the non-bonding region of the display panel, and the second adhesive is positioned at the bonding region of the display panel.

6. The display panel according to claim 5, wherein the surrounding dam comprises a first surrounding dam and a second surrounding dam, the first surrounding dam surrounds an outer periphery of the first adhesive, and the second surrounding dam surrounds an outer periphery of the second adhesive.

7. The display panel according to claim 6, wherein the first surrounding dam is defined with a first vent.

8. The display panel according to claim 6, wherein the second surrounding dam is defined with a second vent.

9. The display panel according to claim 1, wherein the adhesive is solid from start to finish in a manufacturing process of the display panel; and the adhesive comprises a through hole, the through hole corresponds to the first bonding electrode of the driving substrate and the second bonding electrode of the display substrate, and the conductive glue is disposed in the through hole.

10. The display panel according to claim 9, wherein the adhesive comprises an optical clear adhesive.

11. The display panel according to claim 1, wherein the display panel comprises a bonding region and a non-bonding region, and the bonding region surrounds the non-bonding region;

the first bonding electrode of the driving substrate and the second bonding electrode of the display substrate are positioned at the bonding region of the display panel; and the adhesive of the adhering layer comprises a first adhesive and a second adhesive, and the first adhesive is positioned at the non-bonding region of the display panel, and the second adhesive is positioned at the bonding region of the display panel.

12. The display panel according to claim 11, wherein the first adhesive has a liquid state during a manufacturing process of the display panel and has a solid state after the display panel is manufactured, and the second adhesive is solid from start to finish in the manufacturing process of the display panel; and the second adhesive surrounds an outer periphery of the first adhesive, and the second adhesive comprises a through hole corresponding to the first bonding electrode of the driving substrate and the second bonding electrode of the display substrate, and the conductive glue is disposed in the through hole.

13. The display panel according to claim 12, wherein the first adhesive is shaped from the liquid state to the solid state through light curing.

14. The display panel according to claim 12, wherein the second adhesive comprises an optical clear adhesive.

15. The display panel according to claim 11, wherein the first adhesive is solid from start to finish in a manufacturing process of the display panel, and the second adhesive has a liquid state during the manufacturing process of the display panel and has a solid state after the display panel is manufactured; and the adhering layer further comprises a surrounding dam, the second adhesive surrounds an outer periphery of the first adhesive, and the surrounding dam surrounds an outer periphery of the second adhesive.

16. The display panel according to claim 15, wherein the surrounding dam is defined with a second vent.

17. The display panel according to claim 15, wherein the second adhesive is shaped from the liquid state to the solid state through light curing.

18. The display panel according to claim 15, wherein the first adhesive comprises an optical clear adhesive.

19. The display panel according to claim 1, wherein the adhering layer is disposed between the driving substrate and the display substrates, and the adhesive of the adhering layer adheres surfaces of the driving substrate and the display substrates facing one another.

20. A display panel, comprising a non-bonding region and a bonding region surrounding the non-bonding region, and comprising:

a driving substrate, comprising a first bonding electrode positioned at the bonding region and a driving circuit of the display panel;

a display substrate, comprising a second bonding electrode positioned at the bonding region and a display unit of the display panel, wherein the second bonding electrode corresponds to the first bonding electrode of the driving substrate; and an adhering layer, disposed between the driving substrate and the display substrate and comprising a conductive glue and an adhesive, wherein the conductive glue electrically connects the first bonding electrode of the driving substrate and the second bonding electrode of the display substrate to enable the driving circuit to electrically connect the display unit, and the adhesive adheres surfaces of the driving substrate and the display substrate facing each other; and wherein the adhesive of the adhering layer comprises a first adhesive and a second adhesive, and the first adhesive is positioned at the non-bonding region, and the second adhesive is positioned at the bonding region.

* * * * *